United States Patent [19]

Aoyama et al.

[11] Patent Number: 4,696,905
[45] Date of Patent: Sep. 29, 1987

[54] METHOD FOR DIAGNOSING CANCER USING ESR

[75] Inventors: Masaaki Aoyama; Mitsuharu Itabashi; Mariko Miura; Masahiro Kohno, all of Tokyo, Japan

[73] Assignees: Special Reference Laboratories, Inc.; JEOL Ltd., both of Tokyo, Japan

[21] Appl. No.: 608,996

[22] Filed: May 10, 1984

[30] Foreign Application Priority Data

May 13, 1983 [JP] Japan ................................. 58-83651
Dec. 23, 1983 [JP] Japan ................................. 58-243453
Mar. 27, 1984 [JP] Japan ................................. 59-58664

[51] Int. Cl.$^4$ .................... G01N 24/00; G01N 33/48; G01N 33/50
[52] U.S. Cl. ........................................ 436/64; 436/96; 436/97; 436/173
[58] Field of Search .................. 436/64, 96, 97, 173, 436/63; 424/1.1

[56] References Cited

U.S. PATENT DOCUMENTS

| | | | |
|---|---|---|---|
| 4,160,645 | 7/1979 | Ullman | 436/517 |
| 4,334,017 | 6/1982 | Plotkin et al. | 436/501 |
| 4,347,382 | 8/1982 | Scharver | 424/1.1 |
| 4,455,380 | 6/1984 | Adachi | 436/64 |
| 4,485,086 | 11/1984 | Wong | 424/1.1 |

FOREIGN PATENT DOCUMENTS

| | | | |
|---|---|---|---|
| 2123822 | 9/1972 | France | 436/64 |
| 0108483 | 8/1979 | Japan | 436/173 |
| 0135422 | 10/1981 | Japan | 436/64 |
| 0129361 | 8/1983 | Japan | 436/64 |

OTHER PUBLICATIONS

Paxton et al, Chemical Abstract 78: 133049e, 1973.

Primary Examiner—Barry S. Richman
Assistant Examiner—C. M. Delahunty
Attorney, Agent, or Firm—Webb, Burden, Robinson & Webb

[57] ABSTRACT

A method for diagnosis of cancer utilizing an ESR spectrometer comprised a first step for mixing cells from a patient with a solution of hematoporphyrin or hematoporphyrin derivative, a second step for isolating said cells from unreacted reagent and obtaining ESR spectral signal on said cells, a third step for finding quantity $S_x$ of the radicals contained in said cells on the basis of the ESR signal, and a fourth step for comparing value $S_x$ at a predetermined level.

15 Claims, 16 Drawing Figures

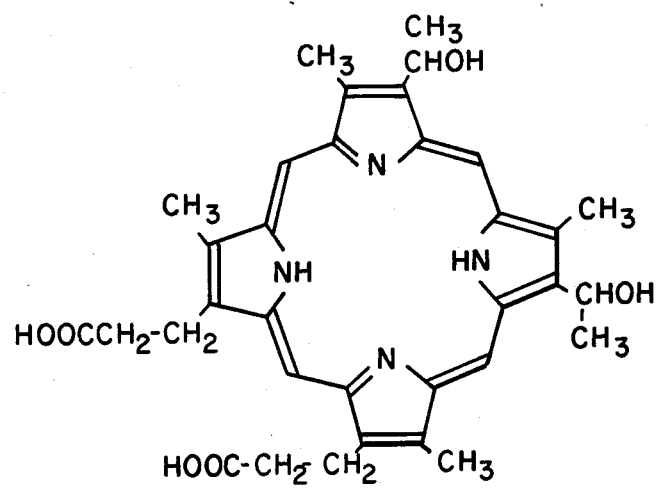
Fig. 1
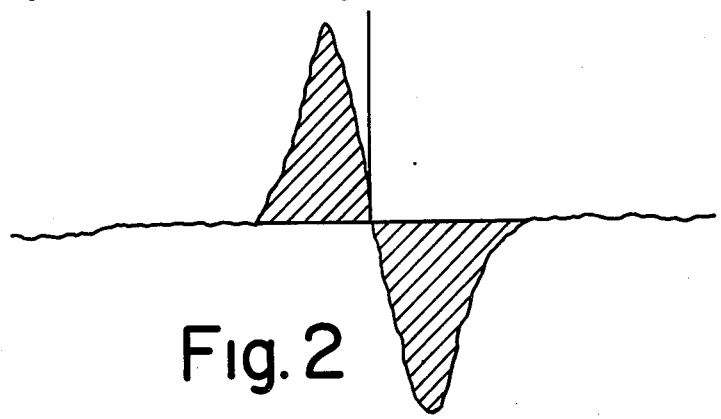
Fig. 2
| | |
|---|---|
| (1) | ISOLATION OF LYMPHOCYTES FROM BLOOD BY CENTRIFUGATION |
| (2) | MIXING OF LYMPHOCYTES WITH A SOLUTION OF HEMATOPORPHYRIN OR ITS DERIVATIVE |
| (3) | INCUBATION FOR 10 MIN. AT 37°C |
| (4) | ISOLATION AND WASHING OF CELLS |
| (5) | INTRODUCTION OF CELLS INTO ESR AND OBTAINING OF ESR SIGNALS WHILE APPLYING A LIGHT RAY |
Fig. 3

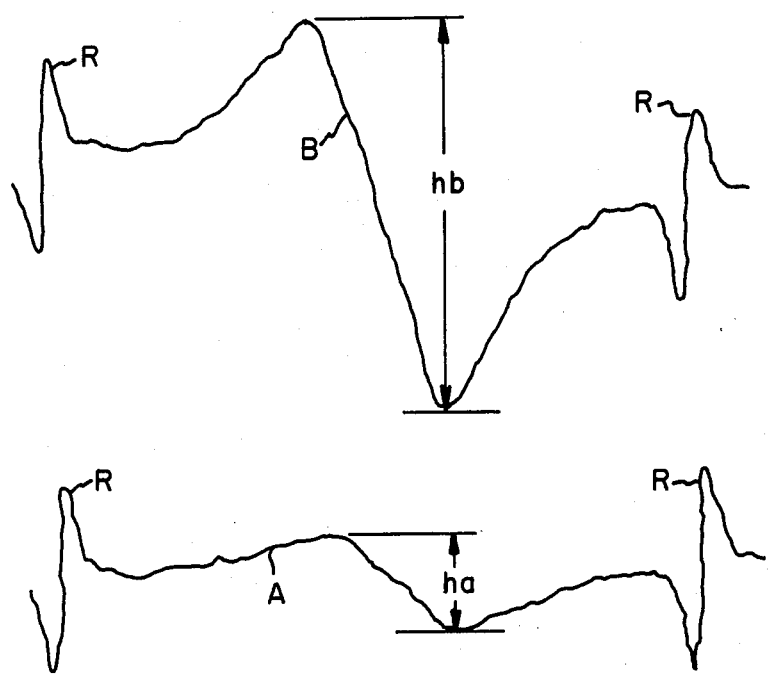
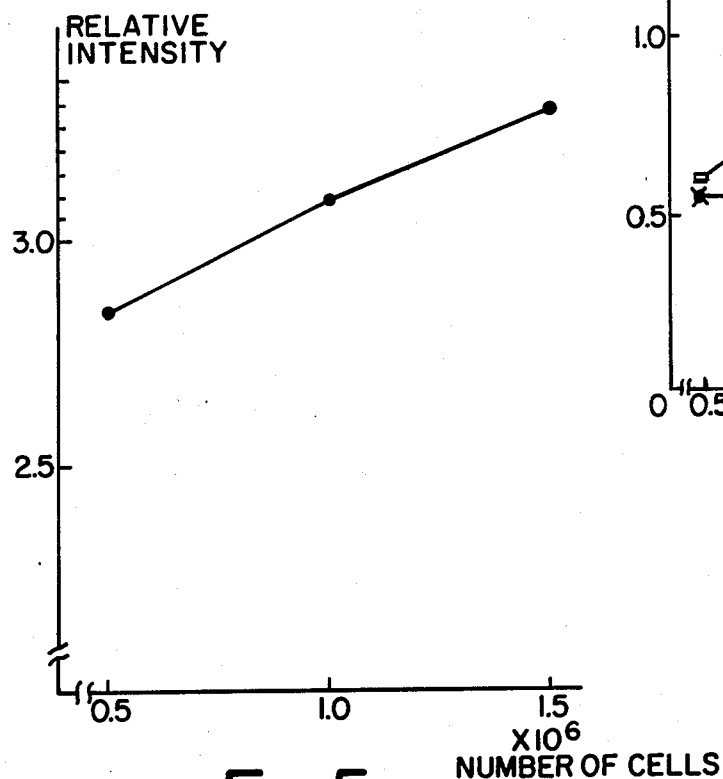
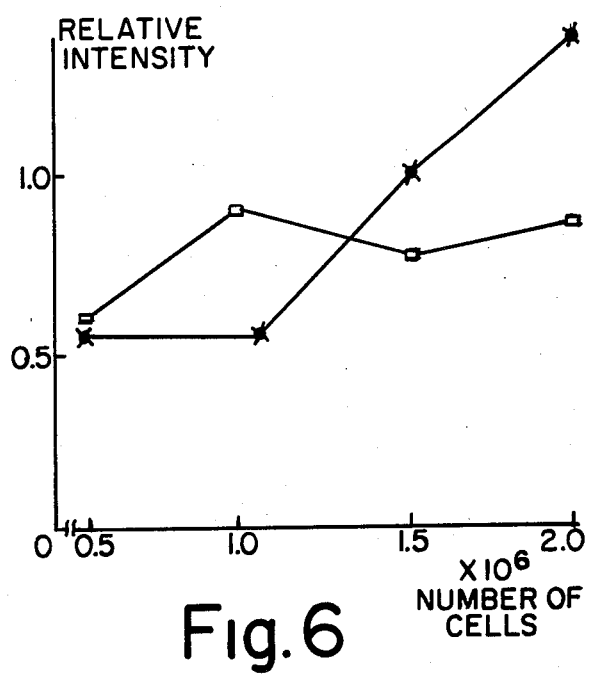
Fig. 4
Fig. 5
Fig. 6

METHOD FOR DIAGNOSING CANCER USING ESR

DESCRIPTION

BACKGROUND OF THE INVENTION

The present invention relates to a method for diagnosing cancer. More specifically, the method permits accurate diagnosis of cancer in vitro through quantitative measurement of radicals found in cells. An ESR spectrometer is used for this purpose, with said cells from a patient mixed with a solution of hematoporphyrin or hematoporphyrin derivative.

In an area of cancer diagnosis, another method that has recently gained in popularity is the one in which a light-sensitive material, such as hematoporphyrin, and a laser beam are used. This method can be summarized as follows:

(a) intravenous injection of a light-sensitive material which has an affinity for tumors;

(b) accumulation of the material in the tumor for three days or more;

(c) application of a laser beam to the tumor through an optical fiber; and (d) observation of fluorescence radiated from the tumor as a result of laser beam irradiation.

Since this method relates to diagnosis in vivo and requires considerable time for accumulation, it is unavoidable that a patient will experience both physical and mental discomfort.

SUMMARY OF THE INVENTION

A principal object of the present invention is to provide a method for diagnosis of cancer in vitro with a minimum of discomfort to the patient.

Another object of the present invention is to provide a method for the correct diagnosis of cancer in vitro within a short period of time.

Briefly, according to this invention:

(a) cells taken from a patient are mixed with a solution of hematoporphyrin or hematoporphyrin derivative;

(b) cells from the mixture are isolated and an ESR spectrum of said cells is obtained;

(c) quantity S of the radicals in said cells is determined; and (d) value S is compared at a predetermined level.

Another feature is that other information regarding the g-value is also taken into consideration. Other features and advantages of the present invention will be apparent by reading the descriptions accompanying the drawings.

BRIEF DESCRIPTION OF THE DRAWINGS

FIG. 1 shows structural formula of hematoporphyrin;

FIG. 2 shows ESR spectrum of hematoporphyrin;

FIG. 3 shows procedures for handling lymphocytes in the present invention;

FIG. 4 shows ESR spectra of a person in good health and of a cancer patient, with both obtained according to the procedure shown in FIG. 3;

FIG. 5 shows the relation between the number of cells and relative intensity of ESR signal;

FIG. 6 shows the voracity influence of macrophages in lymphocytes;

DESCRIPTION OF PRESENT INVENTION

Figure 7:
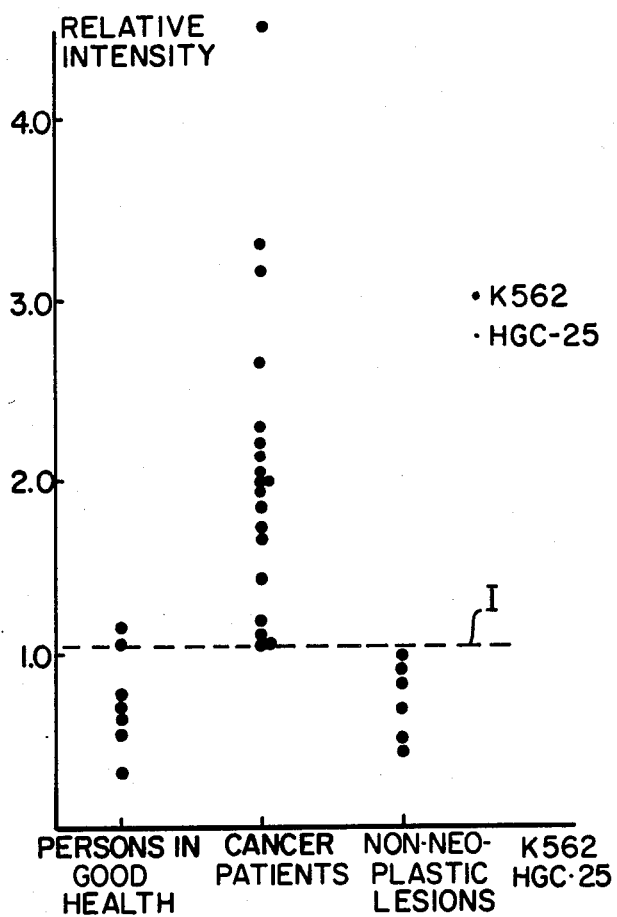
FIG. 7 shows relative intensity of ESR signals from the lymphocytes of 7 persons in good health, 19 cancer patients and 6 HB hepatitis patients, using the FIG. 3 procedure, and shows relative intensity of ESR signals from cancerous cells, K562 and HGC-25, also using the FIG. 3 procedure.

The present invention is based on a novel discovery that cells, such as lymphocytes, extracted from venous blood of a cancer patient provide valuable information on the cancer, and that the information can be obtained by making hematoporphyrin or hematoporphyrin derivative affect these cells. Therefore, the quantity of radicals contained in the cells is measured by an ESR spectrometer.

Hematoporphyrin, whose structural formula is shown in FIG. 1, and its derivatives generate porphyrin radicals when exposed to light; these radicals can be detected by an ESR spectrometer together with those radicals which the cells originally possess.

FIG. 2 shows an ESR signal of radicals derived from hematoporphyrin. In the figure, the ESR signal g-value of said radicals is 2.0015, however, the value is not fixed. In order to improve a sensitivity, the spectrum is obtained at a temperature of 173° K.

With the present invention, measurement is performed according to the following procedure (in digest form in FIG. 3):

(1) by centrifugation, isolating lymphocytes (not containing monocytes) from silica treated blood extracted from a patient;

(2) mixing said lymphocytes with 50 μl of 0.005 mol/l solution of hematoporphyrin or hematoporphyrin derivative;

(3) incubating the mixture for about 10 minutes at a temperature of 37° C.;

(4) isolating lymphocytes from unreacted reagent by 5 minutes centrifugation at 1,500 rpm, and washing said lymphocytes in a physiological saline solution;

(5) introducing a predetermined number of lymphocytes, which are suspended in 200 μl of physiological saline solution, into the ESR spectrometer; obtaining an ESR signal while applying a light ray (ultraviolet ray from a mercury lamp) to the lymphocytes at a temperature of 173° K.

In FIG. 4, "A" is an ESR signal of a person in good health and "B" an ESR signal of a cancer patient. Both were obtained according to the procedure shown in FIG. 3. In the figure, "R" is an ESR signal of a standard sample mixed with lymphocytes for providing standard intensity and g-value. It is clear from the figure that amplitude $h_b$ of a cancer patient is twice as large as $h_a$ of a person in good health; accordingly, the number of radicals contained in the cancer patient's lymphocytes is much greater than that of the person in good health.

FIG. 5 shows the relation between the number of cells and relative intensity of an ESR signal of tumoral erythron K562. It is known from the figure that there is a linear relation between the number of cells and the relative intensity of the ESR signal.

FIG. 6 shows the voracity influence of macrophages in the lymphocytes of a person in good health. In the figure, the "X" line represents a case in which macrophages are mixed with lymphocytes; the "□" line a case in which the macrophages are removed. The figure shows that the radicals in lymphocytes increase when macrophages exist. Accordingly, in order to eliminate the influence of voracity, it is desirable that macrophages be removed by silica gel or the like.

FIG. 7 shows the relative intensity of ESR signals from the lymphocytes of 7 persons in good health, 19 cancer patients and nonneoplastic lesions patients, with each obtained according to the procedure shown in FIG. 3. Likewise, ESR signals from cancerous cells of K562 and HGC-25 were also obtained. It is clear from the figure that since the relative intensity of all cancer patients (mean value: 2.04 1SD0.86) exceeds the relative intensity of persons in good health (mean value: 0.74 1SD0.28), it is possible to draw a line (I) of demarcation between the cancer patients.

The intensity of non-neoplastic lesions patients (mean value: 0.74, 1SD0.22) who are not cancerous shows little difference from that of persons in good health. On the other hand, the intensity of K562 and HGC-25, both cultured cancerous cells, is exceedingly higher rather than that of persons in good health. Consequently, it is possible to correctly diagnose cancer from the information, regarding the quantity of radicals contained in cells; with said information obtained according to the FIG. 3 procedure.

Figure 8:
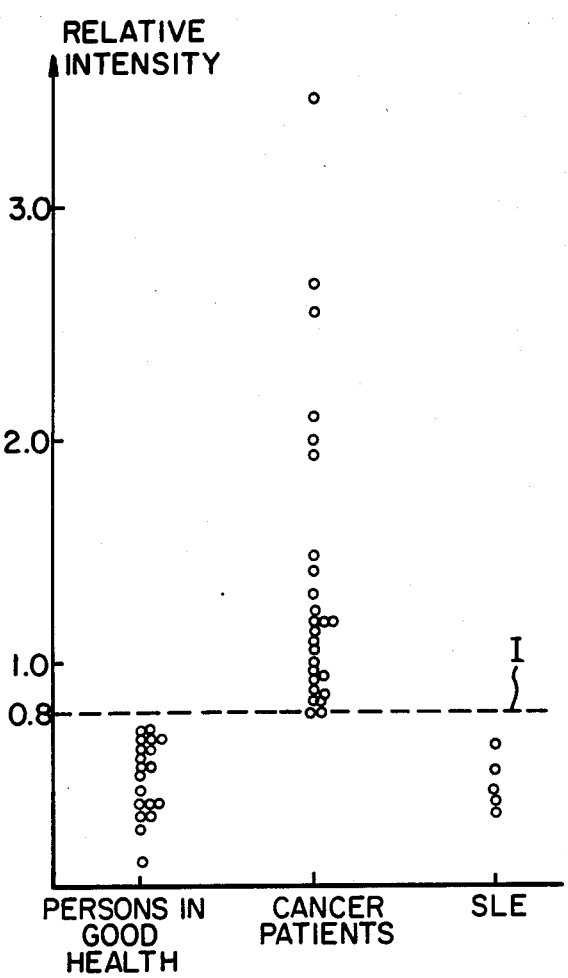
FIG. 8 shows relative intensity of ESR signals from lymphocytes of 26 cancer patients, 22 persons in good health and 5 patients with SLE, with each obtained according to the procedure shown in FIG. 3 and using hematoporphyrin derivative.

Furthermore, in lieu of hematoporphyrin, use of hematoporphyrin derivative improves the diagnosis. FIG. 8 shows the relative intensity of ESR signals from lymphocytes of 26 cancer patients, 21 persons in good health and 5 patients with SLE (systemic lupus erythematosus) with each obtained according to the FIG. 3 procedure by using hematoporphyrin derivative.

In FIG. 8, the relative intensity of all cancer patients exceeds the level of 0.8; on the other hand, the relative intensity of persons in good health and patients with SLE, neither being cancerous, does not exceed said level. Accordingly, FIG. 8 also shows that it is possible to draw a line (I) of demarcation between the cancer patients and other persons and to diagnose cancer in accordance with the line (I).

As shown in FIG. 7, when hematoporphyrin is used, a small area exists where the values of cancer patients and persons in good health overlap; however, as shown in FIG. 8, in the cases where hematoporphyrin derivative is used, such overlapping does not exist. Therefore, a more correct diagnosis of cancer is achieved.

Figure 9:
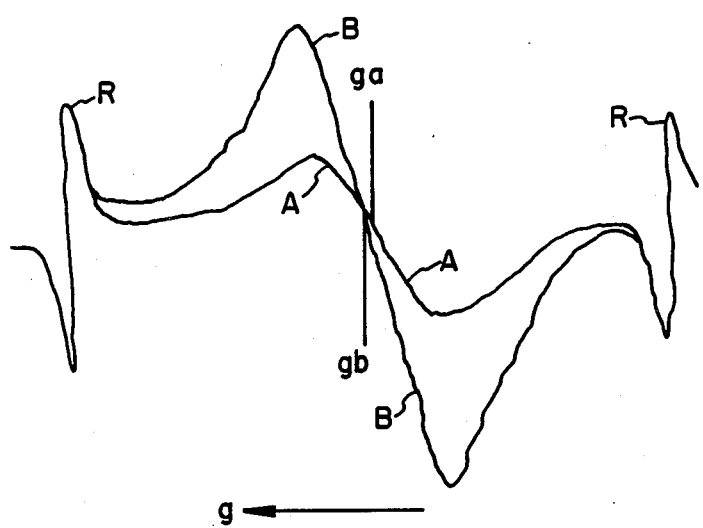
FIG. 9 shows ESR signals from a person in good health and a cancer patient.

The present inventors have further discovered that ESR signals of cancer patients have a tendency to shift in the direction in which the g-value increases, in addition to the aforesaid tendency of increasing the intensity of the ESR signals, resulting from an increase in the quantity of radicals. In FIG. 9, "A" shows an ESR signal of a person in good health and "B" shows an ESR signal of a cancer patient. It can be understood from the figure that "B" has a larger intensity than "A" and that "B" shifts in the direction in which the g-value increases from $g_a$ to $g_b$.

Figure 10:
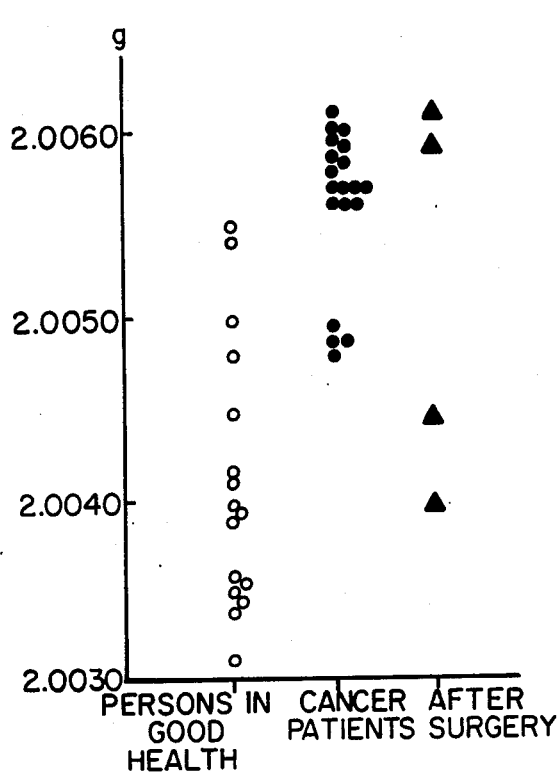
FIG. 10 shows g-values of ESR signals from the lymphocytes of 19 cancer patients, 16 persons in good health and 4 cancer patients after surgery.
Figure 11:
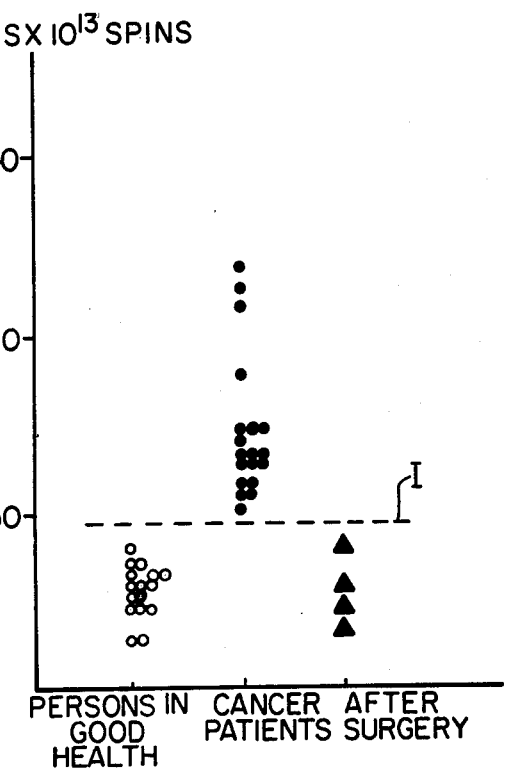
FIG. 11 shows quantity S of radicals contained in lymphocytes of 19 cancer patients, 16 persons in good health and 4 cancer patients after surgery.

To investigate the phenomenon more clearly, the present inventors have obtained ESR signals from 19 cancer patients, 16 persons in good health and 4 cancer patients following surgery, according to the FIG. 3 procedure, by using hematoporphyrin derivative. They have established the g-values of ESR signals and have calculated the quantity of radicals by measuring the superficial content of the ESR signals (shaded area in FIG. 2). FIGS. 10 and 11 are the result. FIG. 10 shows the g-values of ESR signals and FIG. 11 the quantity "S" of radicals, where "O" represents persons in good health, "." cancer patients and " " cancer patients after surgery.

In accordance with FIG. 10, ESR signals of cancer patients have a salient tendency to appear at the position where the g-value is larger than that of persons in good health; however, ESR signals of some of the cancer patients appear where the g-value is similar to that of a person in good health. Accordingly, there is a small reliability problem when diagnosis of cancer is done on the basis of the g-value only.

On the other hand, in FIG. 11 it is possible to draw a line (I) of demarcation between cancer patients and persons in good health. However, since all samples range from $20 \times 10^{13}$ spins to $120 \times 10^{13}$ spins, the dynamic range is not sufficiently wide. And because the line of demarcation is drawn in said range, if data near said line contains errors, there is a possibility of making an incorrect diagnosis of cancer.

To make a correct diagnosis of cancer, two parameters are recommended, namely, a quantitative parameter for the quantity of radicals and a qualitative parameter for the g-value.

Figure 12:
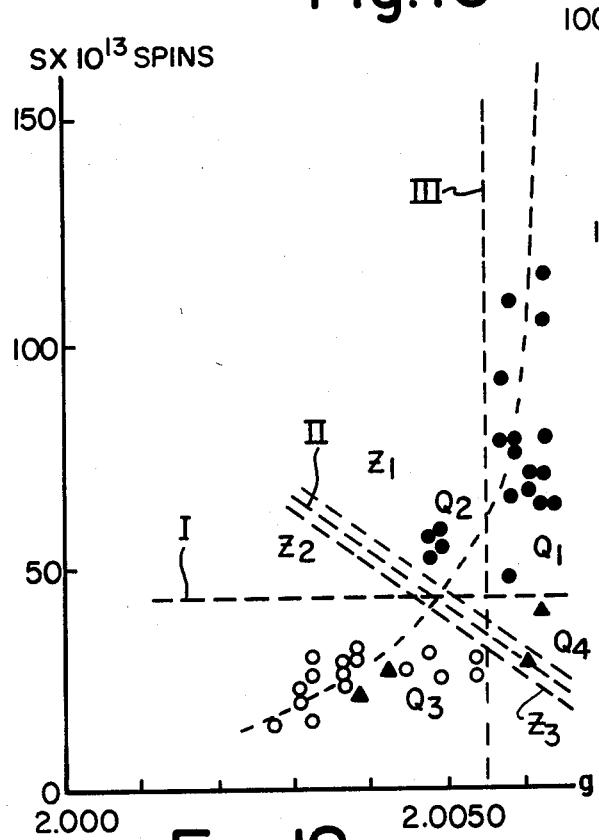
FIG. 12 shows the distribution of all samples shown in FIG. 10 and FIG. 11 on the g-S coordinates.

In FIG. 12, all samples shown in FIGS. 10 and 11 are plotted on the g-S coordinates. The line (I) in FIG. 12 is equivalent to the line (I) in FIG. 11. It is clearly understood from the figure that since all samples are two-dimensionally distributed on the g-S coordinates, a demarcation line (II) which is defined by parameters g and S can be drawn on the g-S coordinates. The line (II) divides the g-S plane into two areas, the upper area $Z_1$ (cancer area) and the lower area $Z_2$ (good health area). Then, after measuring the g-value, $g_x$ and value of S, $S_x$, for about a new sample (X), by judging the area where the point defined by these values $(g_x, S_x)$ locates, it is possible to diagnose whether the new sample exhibits cancer or not. In this case, better reliability is achieved than that case when only one parameter "S" is taken into consideration. In practice, it is desirable to set the indeterminate area $(Z_3)$ in the neighborhood of the line (II).

Furthermore, by drawing a new demarcation line (III) for the g-value, by separating the g-S plane by said line (III) and the aforesaid line (I) for the value S into four areas, $Q_1$ (cancer area), $Q_2$ (indeterminate area), $Q_3$ (good health area) and $Q_4$ (indeterminate area), and by determining where the point defined by $(g_x, S_x)$ locates, it is also possible to diagnose whether the new sample exhibits cancer or not.

In the case of FIG. 12, original data $g_x$ and $S_x$ is used for defining the position, while adding some mathematical treatment is effective.

Figure 13:
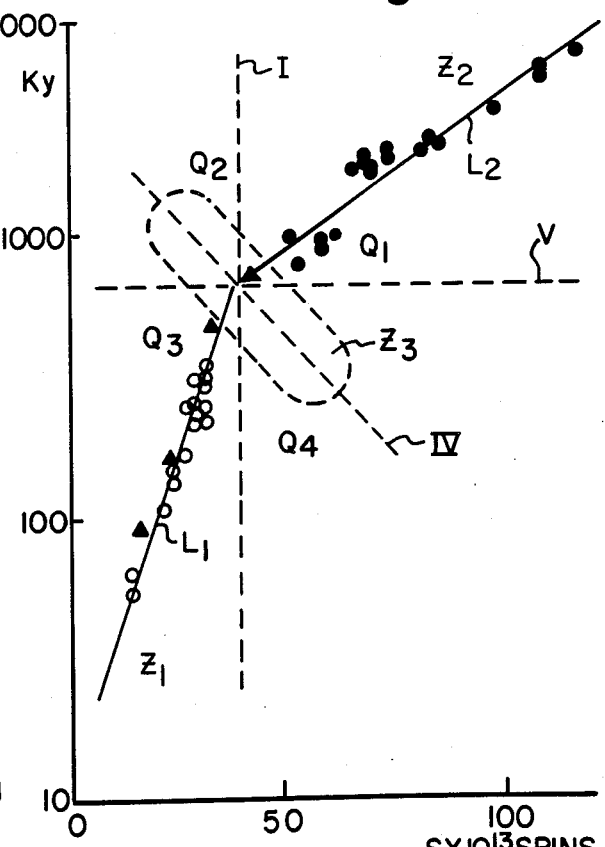
FIG. 13 shows the relation between S and Ky.

In FIG. 13, samples are plotted on the S-Ky coordinates, and the Ky is defined by the following formula:

$$Ky=((g_x-g_0)\times 1{,}000)\log S_x \quad (1)$$

where $g_0$ is a constant, for example, $g_0=2.0000$ (in FIG. 13).

It can be understood from the figure that a demarcation line (IV) can be drawn on the S-Ky plane, that the line divides said plane into three areas, $Z_1$ (cancer area), $Z_2$ (good health area) and $Z_3$ (indeterminate area). Accordingly, by judging the area where the point for specimen X defined by the couplet (Sx, Kx) locates, it is possible to determine whether the new sample exhibits cancer or not.

In FIG. 13, calibration curve $L_1$ of persons in good health and $L_2$ of cancer patients can be drawn. Since the more advanced cases locate at the upper part of $L_2$, the degree of cancer progression can be known.

Furthermore, for persons in good health, Ky is within the relatively narrow range of 5 through 100; for cancer patients, Ky is within the relatively wide range of 100 to 1,000 or more (FIG. 13). Accordingly, it is possible to diagnose cancer without developing in the direction of S. Such being the case, diagnosis is made by observing only the value of Ky and judging whether the value exceeds the level of the demarcation line (V) or not. In this case, since the dynamic range of Ky is far wider than the original data (S), resolution and reliability can be improved.

Figure 14:
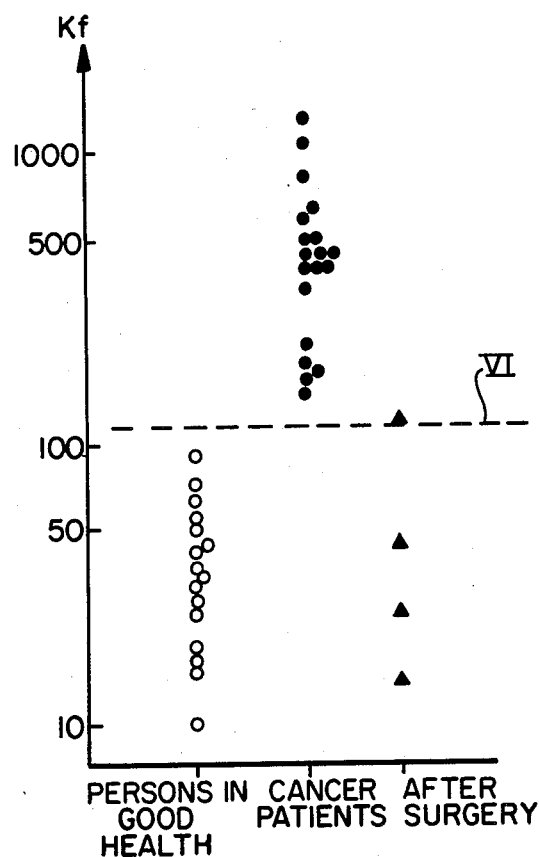
FIG. 14 shows Kf of all samples shown in FIG. 10 and FIG. 11.

In FIG. 14, all samples are plotted in accordance with the value of Kf, which is defined by the following formula:

$$Kf=(g_x-g_0)\times 1{,}000\times \log S_x \quad (2).$$

It can be understood from the figure that for persons in good health, Kf is within the relatively narrow range of 10 through 100; for cancer patients, Kf is within the relatively wide range of 140 through 1,000 or more. Thus, it is possible to draw a demarcation line (VI) between Kf=100 and Kf=140 and to diagnose cancer according to said line (VI). In this case, since the dynamic range of Kf is far wider than the original data (S), resolution and reliability can be improved.

Since the more advanced cases of cancer indicate a high value of Kf, it is possible to know the degree of progression.

Further, by plotting all samples on the S-Kf coordinates, a graph similar to FIG. 13 is obtained and diagnosis is possible according to said graph.

Figure 15:
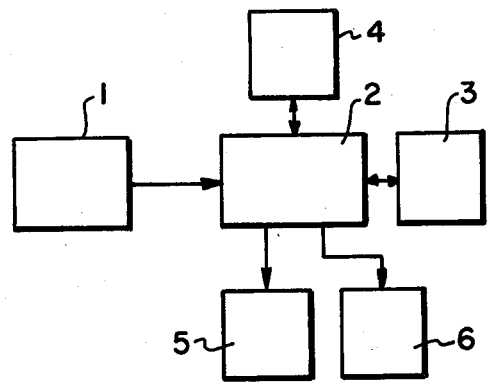
FIG. 15 shows the composition of system used for diagnosis with the present invention.

In FIG. 15, ESR spectral data obtained by an ESR spectrometer 1 is sent to a computer 2 and stored in the memory 3. Data on demarcation lines I, II, III, IV, V and VI is stored in the read only memory 4. The results of cancer diagnosis performed by the computer 2 are sent to the recorder 5 and/or printer 6.

Figure 16:
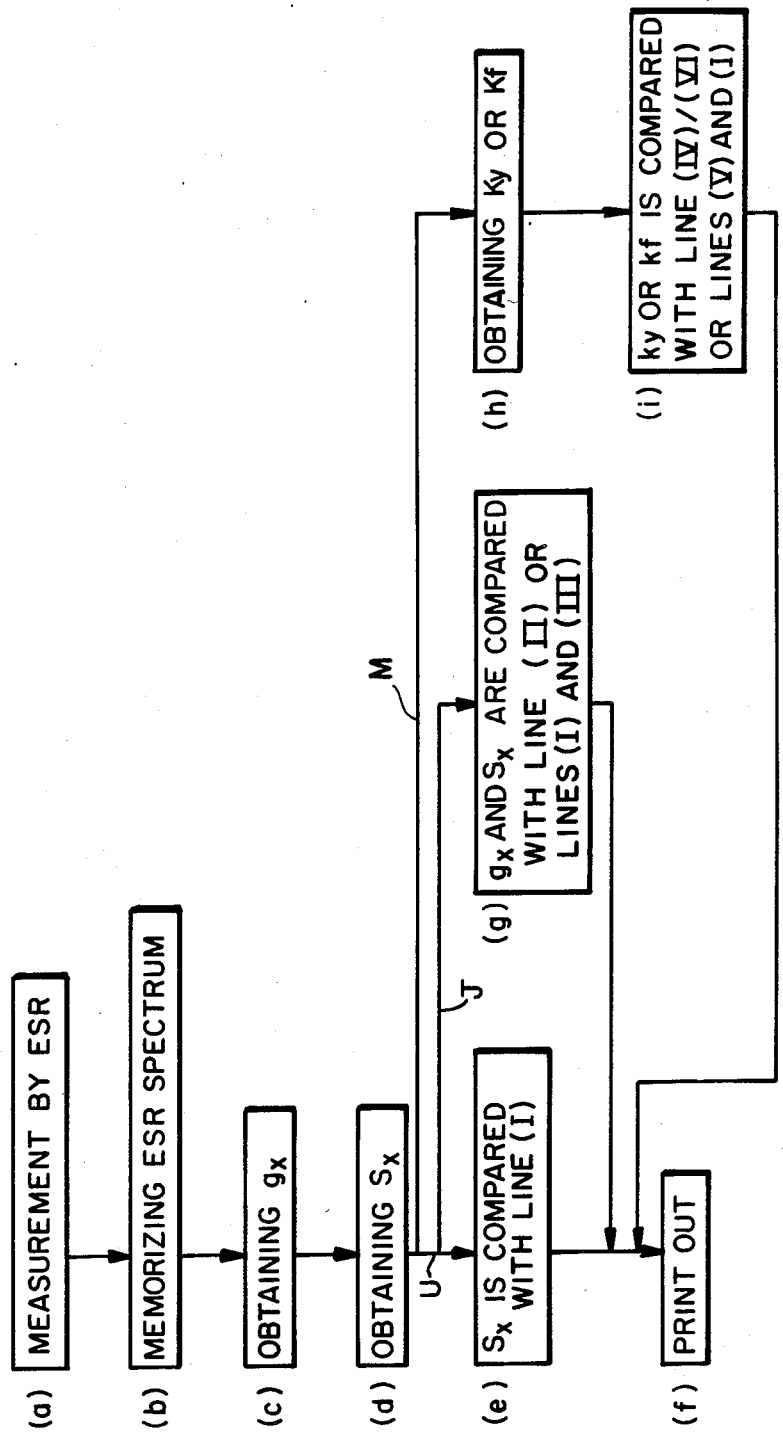
FIG. 16 shows an operation flow chart of system shown in FIG. 15.

By referring to FIG. 16, the system shown in FIG. 15 operates as follows:

(a) ESR signals are obtained by the ESR spectrometer 1 from a given sample according to the FIG. 3 procedure;

(b) Spectral data is stored in the memory 3;

(c) the value of $g_x$ is determined from the spectral data by the computer 2;

(d) the value of $S_x$ is established by computing the superficial content of the ESR signal;

When diagnosis is performed according to the demarcation line (I) following the line (U):

(e) said data of $S_x$ and the data on the demarcation line (I) are compared, and it is determined whether the value of $S_x$ is larger than the level of line (I) or smaller;

(f) the results are printed out by the printer 6.

When diagnosis is done according to the demarcation line (II) or according to the lines (I) and (III) following the line (J):

(g) said data of $g_x$ and $S_x$ and the data on the demarcation line (II) or lines (I) and (III) are compared, and the area where the point defined by ($S_x$, $g_x$) locates is determined among the good health area, cancer area and indeterminate area;

(f) the results are printed out by the printer 6.

When diagnosis is done according to demarcation lines (IV), (V), or (VI), following the line (M):

(h) the value of Ky or Kf is found by calculation according to the aforesaid formulas (1) or (2);

(i) said data of Ky or Kf and the data on demarcation lines (IV) or (VI), or the data regarding the demarcation lines (V) and (I) are compared, it is determined that the point defined by Ky or Kf locates in the good health area, cancer area or indeterminate area;

(f) the results are printed out by the printer 6.

In the case of lines (I) and (V), data $S_x$ must also be taken into consideration.

In the preferred description, the value of $g_x$ is determined by the computer 2, however, it is expected that the operator determines the value of $g_x$ on the basis of the ESR spectrum drawn on the chart of the recorder 5, and enter the value of $g_x$ in the computer 2.

Having thus defined our invention with the detail and particularity required by the Patent Laws, what is desired protected by Letters Patent is set forth in the following claims.

We claim:

1. A method for diagnosis of cancer in vitro utilizing an ESR spectrometer for quantitative measurements of radicals found in lymphocytes taken from a patient, comprising the steps of:

(a) mixing cells from a patient with a reagent solution, selected from the group consisting of hematoporphyrin and hematoporphyrin derivatives;

(b) isolating the resulting reaction product from unreacted reagent;

(c) irradiating said reaction product with light to generate porphyrin radicals.

(d) obtaining an ESR spectral signal, $S_x$, of said reaction product indicative of the quantity of radicals contained therein; and (e) diagnosing the presence or absence of cancer on the basis of value $S_x$ by comparing $S_x$ to S values preestablished to be indicative of cancerous and/or noncancerous states.

2. The method of claim 1 wherein the ESR spectral signal is obtained at a temperature about 173° K.

3. The method of claims 1 or 2 wherein the ESR spectral signal is obtained by irradiating the reaction product with a light beam.

4. A method for diagnosis of cancer in vitro utilizing an ESR spectrometer for quantitative measurement of radicals found in lymphocytes taken from a patient, comprising the steps of:

(a) isolating lymphocytes from blood extracted from a patient;

(b) mixing said lymphocytes with a solution selected from the group consisting of hematoporphyrin and hematoporphyrin derivatives;

(c) isolating the resulting reaction product from the mixture;

(d) irradiating said reaction product with light to generate porphyrin radicals, (e) obtaining ESR spectral signal of said reaction product;

(f) determining a value $S_x$ indicative of the quantity of the radicals contained in said reaction product on the basis of the ESR signal; and (g) diagnosing for the presence or absence of cancer on the basis of value $S_x$ by comparing $S_x$ to S values preestablished to be indicative of cancerous and/or noncancerous states.

5. The method of claim 4 wherein the ESR spectral signal is obtained at a temperature about 173° K.

6. The method of claims 4 or 5 wherein the ESR spectral signal is obtained by irradiating said reaction product with a light beam.

7. A method for diagnosis of cancer in vitro utilizing an ESR spectrometer for quantitative measurement of radicals found in lymphocytes taken from a patient, comprising the steps of:

(a) mixing cells from a patient with a reagent solution, selected from the group consisting of hematoporphyrin; and hematoporphyrin, derivatives;

(b) isolating the resulting reaction product from unreacted reagent;

(c) irradiating said reaction product with light to generate porphyrin radicals, (d) obtaining ESR spectral signal of said reaction product;

(e) determining the value, $S_x$, indicative of the quantity of radicals contained in said reaction product and determining a g-value, $g_x$, of said radicals on the basis of the ESR signal; and (f) diagnosing the presence or absence of cancer on the basis of the values $S_x$ and $g_x$ by comparing to S values and a value preestablished to be indicative of cancerous and/or noncancerous states.

8. The method of claim 7 wherein the ESR spectral signal is obtained at a temperature about 173° K.

9. The method of claim 7 or 8 wherein said step of diagnosing consists of determining the location of a point defined by $S_x$ and $g_x$ on a plot of Sg coordinates having empirically established areas which are representative of cancerous and noncancerous states.

10. The method of claim 7 wherein said step of diagnosing consists of determining a value K of a mathematical function, K, using $S_x$ and $g_x$ and determining the location of a point defined by $S_x$ and $K_x$ on a plot of S-K coordinates having empirically established areas which are representative of cancerous and noncancerous states.

11. The method of claim 10 wherein said mathematical function comprises multiplication.

12. The method of claim 10 wherein said mathematical function comprises an exponential function, K.

13. The method of claim 7 wherein said step of diagnosing comprises finding a value $K_x$ of a mathematical function, K, using $S_x$ and $g_x$ and comparing the value $K_x$ to values of K prestablished to be representative of cancerous and/or noncancerous states.

14. The method of claim 13 wherein said mathematical function, K, comprises multiplication.

15. The method of claim 13 wherein said mathematical function comprises an exponential function, K.

* * * * *

UNITED STATES PATENT AND TRADEMARK OFFICE
CERTIFICATE OF CORRECTION

PATENT NO. : 4,696,905

DATED : September 29, 1987

INVENTOR(S) : Masaaki Aoyama et al.

It is certified that error appears in the above-identified patent and that said Letters Patent is hereby corrected as shown below:

Column 4 Line 19 " " should read --▲--.

Column 4 Line 53 Delete --about a--.

Column 4 Line 57 After "that" insert --in the--.

IN THE CLAIMS:

Claim 7 - Column 7 Line 30 Delete --;-- (first occurrence) and delete --,--.

Claim 7 Column 8 Line 7 "a value" should read --g values--.

Claim 9 - Column 8 Line 13 "Sg" should read --S-g--.

UNITED STATES PATENT AND TRADEMARK OFFICE
CERTIFICATE OF CORRECTION

PATENT NO. : 4,696,905

DATED : September 29, 1987

INVENTOR(S) : Masaaki Aoyama et al.

It is certified that error appears in the above-identified patent and that said Letters Patent is hereby corrected as shown below:

Claim 12 - Column 8 Line 26 After "function" (first occurrence) insert —,K,—.

Claim 12 - Column 8 Line 26 After "function" (second occurrence) delete —,K—,

Claim 15 - Column 8 Line 35 After "function" (first occurrence) insert —,K,—.

Claim 15 - Column 8 Line 35 After "function" (second occurrence) delete —,K—.

Signed and Sealed this

Seventeenth Day of May, 1988

Attest:

DONALD J. QUIGG

*Attesting Officer*  *Commissioner of Patents and Trademarks*